United States Patent [19]
Lee et al.

[11] Patent Number: 5,776,793
[45] Date of Patent: Jul. 7, 1998

[54] METHOD OF FABRICATING OPTO-ELECTRONIC DEVICE

[75] Inventors: Ming-Kwei Lee; Min-Yen Yeh, both of Kaouhsiung, Taiwan

[73] Assignee: National Science Council, Taipei, Taiwan

[21] Appl. No.: 672,107

[22] Filed: Jun. 27, 1996

[51] Int. Cl.$^6$ .................................................. H01L 21/00
[52] U.S. Cl. ............................................ 438/35; 438/47
[58] Field of Search ............................ 437/126; 438/35, 438/47

[56] References Cited

U.S. PATENT DOCUMENTS

| | | | |
|---|---|---|---|
| 4,422,888 | 12/1983 | Stutius | 148/DIG. 110 |
| 4,632,711 | 12/1986 | Fujita et al. | 148/DIG. 110 |
| 5,150,191 | 9/1992 | Montegi et al. | 257/78 |
| 5,278,856 | 1/1994 | Migita et al. | 372/45 |
| 5,306,662 | 4/1994 | Nakamura et al. | 437/126 |

OTHER PUBLICATIONS

Taskar et al., "Novel technique for p-type nitrogen doped ZnSe epitaxial layers," Appl. Phys. Lett., vol. 62, No. 3., pp. 270-272, Jan. 18, 1993.

Morimoto et al., "Nitrogen radical doping during metalorganic vapor phase epitaxy of ZnSe," Appl. Phys. Lett., vol. 63, No. 17., pp. 2384-2386, Oct. 25, 1993.

Stutius, "Conduction mechanism in low-resistivity n-type ZnSe prepared by organometallic chemical vapor deposition," J. Appl. Phys., vol. 53, No. 1., pp. 284-291, Jan. 1, 1982.

Hauksson et al., "Compensation processes in nitrogen doped ZnSe," Appl. Phys. Lett., vol. 61, No. 18., pp. 2208-2210, Nov. 2, 1992.

Primary Examiner—Brian Dutton
Attorney, Agent, or Firm—Klein & Szekeres, LLP

[57] ABSTRACT

A method of fabricating opto-electronic device includes steps of introducing a first reacting gas flow, a second reacting gas flow and (a) dopant(s) into a reactor to form epilayer(s) on a substrate wherein the ratio of the first reacting gas and the second reacting gas is different in each reacting stages. By providing suitable epilayer growth conditions which need neither expensive equipment nor highly technical steps, high quality doped ZnSe can be obtained and fabricating pure blue light light-emitting diode becomes possible.

14 Claims, 5 Drawing Sheets

METHOD OF FABRICATING OPTO-ELECTRONIC DEVICE

FIELD OF INVENTION

The present invention generally relates to a method for fabricating an opto-electronic device, and more particularly to a method for fabricating a blue light light-emitting diode.

BACKGROUND OF THE INVENTION

Because of the great progress in research and development of opto-electronic technology and the successful employment of semiconductor compound material in fabricating opto-electronic device, light-emitting semiconductor devices from the infrared region to the visible green light region are available in application. The research, development and fabrication of blue light or shorter wavelength device are still in need. If it is applied in blue light light-emitting diode, together with red and green diodes, making a true color plane monitor will become possible. The monitor will have the following features: (1) being able to directly connect with a logic circuit by series connection, (2) large in area but small in size, (3) high intensity, and (4) low power consumption. If the diode is used in a short wavelength laser, it can be applied in a micro-particle sensor. It can also be used in a laser reading head. Because the short wave length of blue light makes the resolution higher, the capacity of the compact disk can thus be greatly enhanced. Undoubtedly, the research and development of light-emitting device of short wavelength light such as blue light brook no delay. Compared with other materials, the wide band-gap of II–VI compounds have the potential to be used for short wavelength semiconductor device. For example, the direct band gap of Zinc selenide (ZnSe) is 2.68 eV, which falls in the range of blue-light, so it is a perfect material for fabricating blue light light-emitting devices.

In the prior arts, it is difficult to get high quality and highly conductive p-type or n-type II–VI compound epilayers, especially those highly conductive p-type II–VI compound epilayers. For methods of fabricating II–VI compounds such as ZnSe nowadays, in molecular beam epitaxy (MBE), nitrogen ions are used as the nitrogen source for doping (K. Morimoto and T. Fujino, Appl. Phys. Lett. 63, (1993) 2384). In organometallic vapor phase epitaxy (OMVPE), ammonia ($NH_3$) is the nitrogen source. These methods require expensive equipments and further steps such as electron-beam annealing or high temperature annealing after the growth of epilayers (N. R. Taskar, B. A. Khan, D. R. Dorman and K. Shahzad, Appl. Phys. Lett. 62 (1993) 270). These reasons make this kind of material difficult to fabricate high quality opto-electronic devices.

SUMMARY OF THE INVENTION

An object of the present invention is to provide a suitable method to fabricate an opto-electronic device, which needs no expensive equipment or further step after growth of epilayers.

Another object of the present invention is to further fabricate II–VI compound p/n junction blue light light-emitting diodes.

The basic concept of the present invention is to provide suitable conditions for each epilayer growth.

Since the II–VI compound materials have the property of self compensation, they tend to have the n-type material property, which make it difficult to proceed with the p-type doping. Taking ZnSe for example, in the general condition, a p-type epilayer is impossible to be obtained because Se vacancy will result in double donor and single donor relating to Se vacancy (Vse—Zn—Nse) (L. S. Hauksson, J. Simpson, S. Y. Wang and K. A. Prior, Appl. Phys. Lett. 61 (1992) 2208). Thus upon proceeding with doping under a specific Se/Zn ratio, the Se vacancy can be eliminated, which makes the p-doping procedure possible.

Upon proceeding with n-type doping, aluminum (Al), gallium(Ga) or indium (In) is often used. It is not difficult to obtain an n-type II–VI material epilayer of low resistivity, however, it is difficult to avoid the existence of self-activation centers (SA centers) which deteriorate not only the character of emitting blue light but also the character of the p/n junction. In the case of ZnSe, this is due to the vacancy of Zn(W. Stutius, J. Appl. Phys. 53 (1982) 284). If we process n-doping under another specific Se/Zn ratio, we can eliminate the Zn vacancy and further eliminate the SA center.

In a non-doping epitaxy process, the flow rate of hydrogen selenide ($H_2Se$), diethylzinc (DEZn), ammonia ($NH_3$) and triethylaluminum (TEA1) are 25 sccm, 6 sccm, 3–10 sccm, and 1.6–3.2 sccm, respectively. The main flow rate of hydrogen is 2 slm. Compared to the above condition, we proceed with n-doping in a Zn-rich condition and p-doping in a Se-rich condition. In the present invention, Se/Zn can be 3~5 for an n-type doping and 7~9 for a p-type doping.

With the method of the present invention, high quality n-type or p-type epilayer can be obtained to fabricate opto-electric devices.

In a specific embodiment, the present method of fabricating an opto-electronic device comprises the following steps: a) providing a reactor; b) placing a substrate into said reactor; c) providing a Se-containing gas flow; d) providing a Zn-containing gas flow; e) providing a n-type dopant; f) introducing said Se-containing gas flow and said Zn-containing gas flow in a Se/Zn ratio from about 3 to about 5 into and introducing said n-dopant into said reactor to form a n-type layer on said substrate.

The method of fabricating an opto-electronic device further comprises the following steps: g) providing a p-type dopant; h) introducing said Se-containing gas flow and said Zn-containing gas flow in a Se/Zn ratio from about 7 to about 9 into and introducing said p-dopant into said reactor to form a p-type layer on said n-type layer.

Alternatively, the steps g) and h) can be proceeded before the steps of e) and f).

The present invention can be better understood with reference to the following description and accompanying drawing, in which:

DETAILED DESCRIPTION OF THE PREFERRED EMBODIMENTS

Because of the material ZnSe itself has the property of self compensation, which makes ZnSe tend to be an n-type material, so it is difficult to control during p-doping period. Thus, p-doping and n-doping processes should have different considerations and conditions.

The present invention uses different specific Zn/Se ratio ranges to make suitable epitaxy conditions respectively for p- and n-type dopings. In this epitaxy condition, p-type ($\rho$=0.5 $\Omega$–cm) and n-type ($\rho$=0.01 $\Omega$–cm) epilayers of high quality and low resistivity can be easily fabricated and no expensive equipment or further step after doping is needed. These high quality ZnSe epilayers in the present invention can be further used to fabricate ZnSe p/n junction pure blue light light-emitting diode the wave-length of emitting light of which and the full width in half maximum are 461 nm and 52 meV, respectively.

The present embodiment uses $(100)^+$-GaSe as a substrate 14, hydrogen selenide ($H_2Se$) (kept tinder 0° C.) and diethylzinc (DEZn) (kept in room temperature, 20 C.) as reacting gases to grow ZnSe epilayer. Triethylaluminum (TEAl) (kept under –20° C.) is the n-type dopant; ammonia ($NH_3$) is the p-type dopant.

In a specific embodiment, $H_2Se$/DEZn is 4 upon n-type doping; $H_2Se$/DEZn is 8 upon p- type doping.

Figure 1:
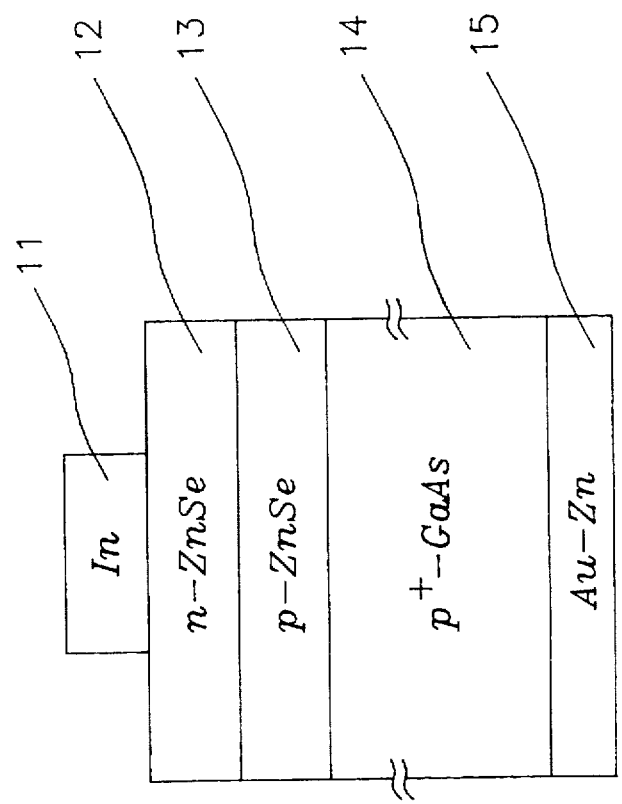
FIG. 1 shows a schematic view of a preferred embodiment of an opto-electronic device according to the present invention.

Please refer to FIG. 1, the schematic view of a blue light light-emitting diode of a preferred embodiment according to the present invention. The n-ZnSe/p-ZnSe/p$^+$-GaAs has been successfully fabricated via low pressure organometallic vapor phase epitaxy. The final structure of the device of the present embodiment includes a gold-zinc (Au—Zn) ohmic contact 15, an indium (In) ohmic contact 11, and a $(100)p^+$-GaAs substrate 14 ($\rho=2\times10^{-3}$ $\Omega$–cm). Under the epitaxy condition of $H_2Se$/DEZn=8, at 380° C., after 2 hours of growing on the substrate 14, the p-type ZnSe:N epilayer 13 is formed to have a thickness of 2 µm. Under the epitaxy condition of $H_2Se$/DEZn=4, 380° C., after 30 minutes of growing on the epilayer 13, the n-type ZnSe:Al epilayer 12 is formed to have a thickness of 0.6 µM. Measuring via Hall effect, we can obtain the p-ZnSe concentration of $5\times10^{17}$ cm$^{-3}$ and the n-ZnSe concentration of $3\times10^{18}$ cm$^{-3}$.

Figure 2:
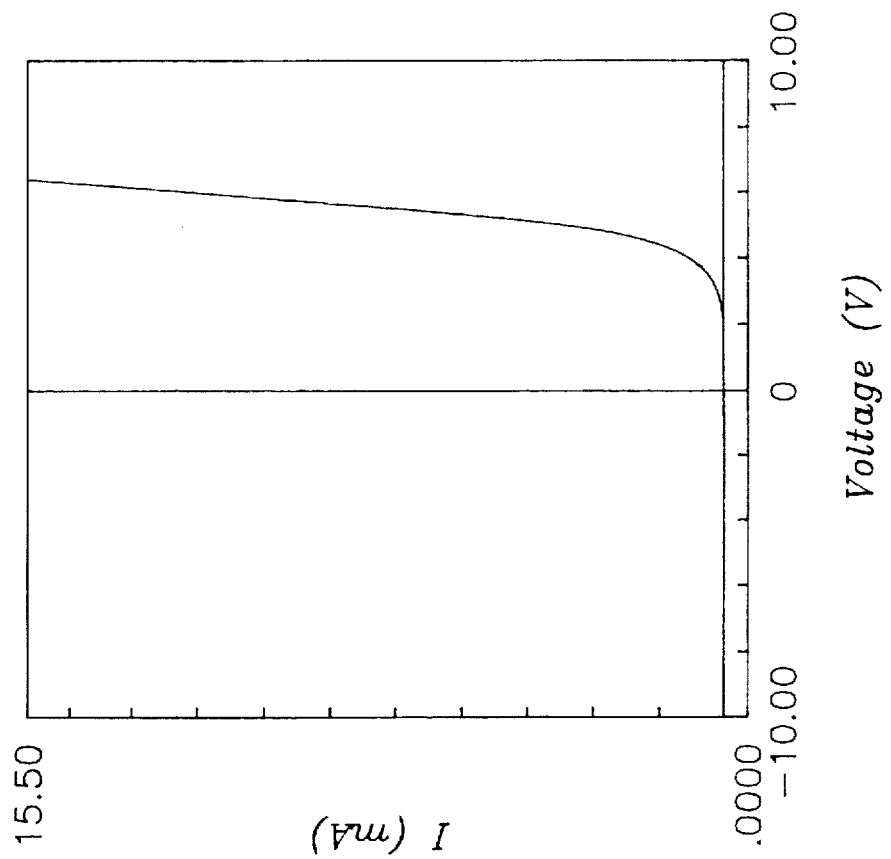
FIG. 2 is a current (I)-voltage (V) characteristic curve of a preferred embodiment of an opto-electronic device according to the present invention at the room temperature.

Please refer to FIG. 2, which shows the current(I)-voltage (V) characteristic curve of a blue light light-emitting diode under room temperature. The cut-in voltage of the blue light light-emitting diode is 1.2 V. Measured by instrument, the reverse leakage current is 6.4 nA when the reverse-bias is –5 V.

Figure 3:
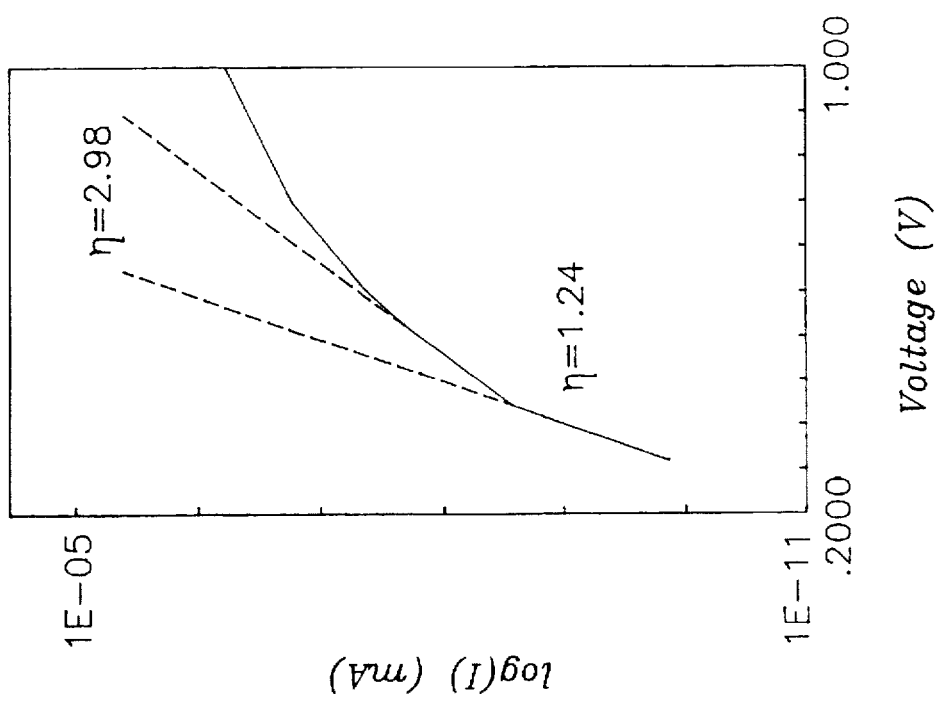
FIG. 3 is a log(I)-bias characteristic curve of a preferred embodiment of an opto-electronic device according to the present invention under the room temperature.

Please refer to FIG. 3, which shows the characteristic curve of log(I)-bias of the blue light light-emitting diode under room temperature. The ideal parameter can be obtained from the slop of the graph. In the region of small current, the ideal parameter is 1.24. In this region, the diffusion current is predominant. When the current keeps on increasing, because the effect of series resistance of the metal junction and the neutral zone is more significant, the ideal parameter is thus increased (to e.g. 2.98).

Figure 4:
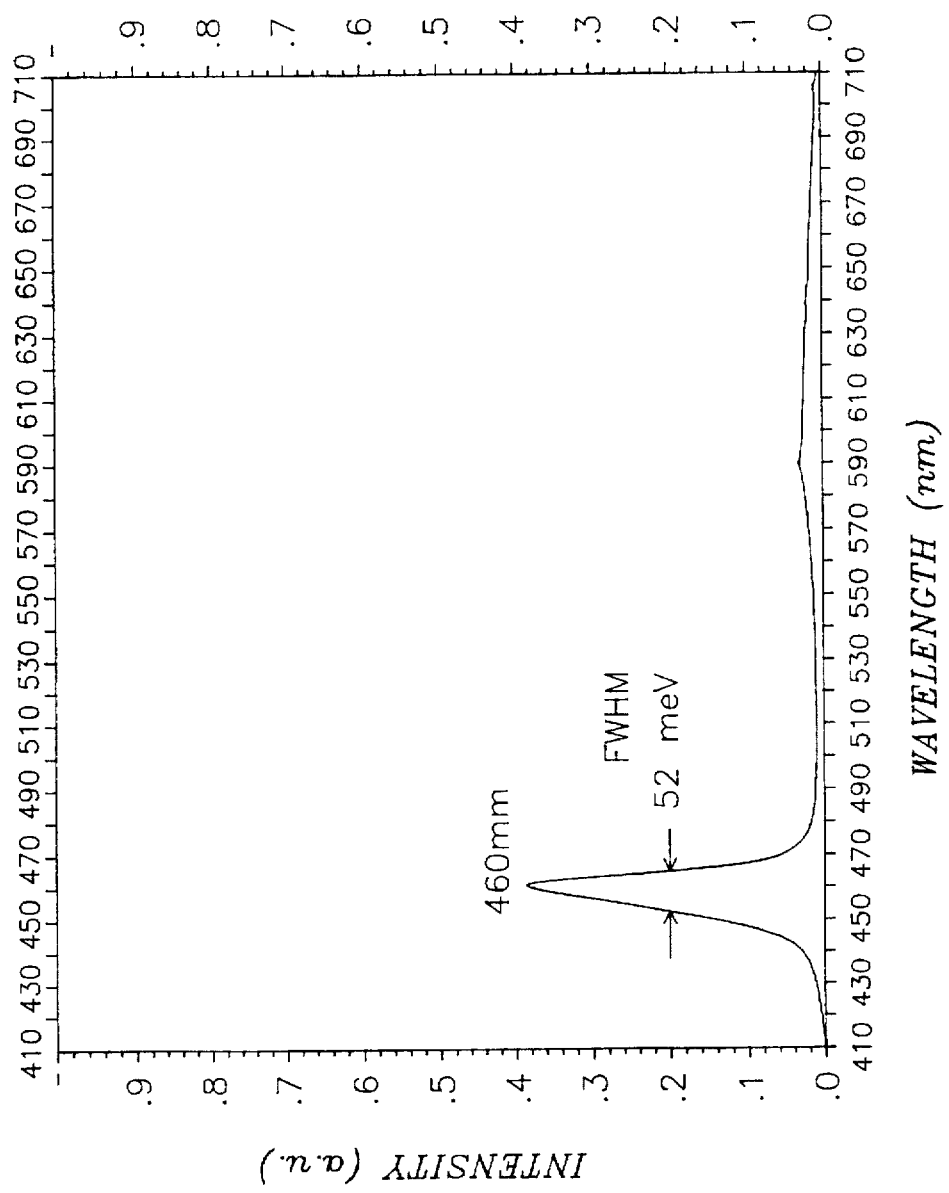
FIG. 4 is an electroluminescence spectrum of a preferred embodiment of an opto-electronic device according to the present invention.

Please refer to FIG. 4, which shows the photoluminescence spectrum of the blue light light-emitting diode under room temperature. The light emitting wave-length is 460 nm (2.68 eV), and the full width in half maximum (FWHM) is only 52 meV.

Figure 5:
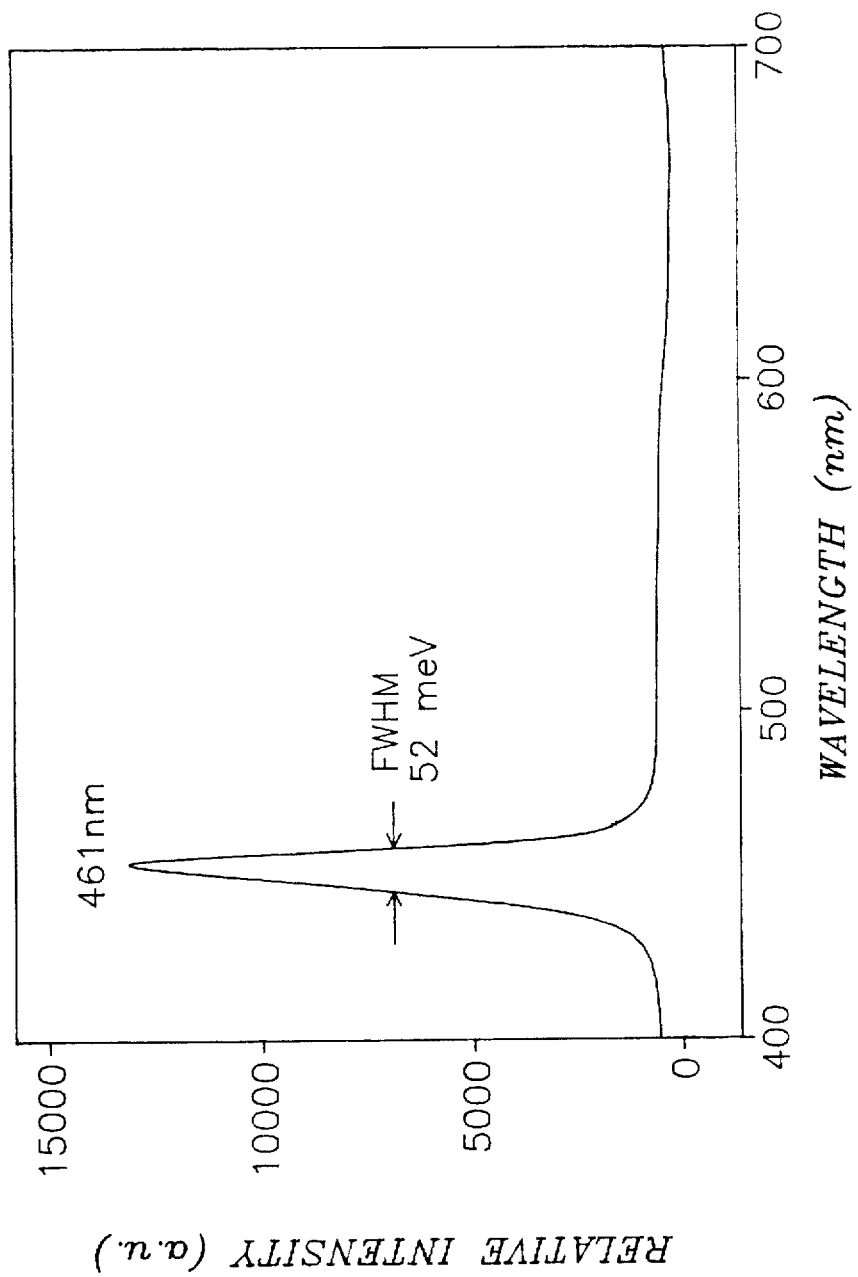
FIG. 5 is a photoluminescence spectrum of a preferred embodiment of an opto-electronic device according to the present invention.

Please refer to FIG. 5, which shows the electroluminescence spectrum of the n-ZnSe/p-ZnSe/P$^+$-GaAs blue light light emitting diode. The operating current is 3 mA, light emitting wave-length is 461 nm, and the half height width is 52 meV, too. The mentioned data consistent with the photoluminescence spectrum and are exactly the same as the direct band gap of ZnSe.

From the above, high quality p-type and n-type ZnSe can be fabricated in a suitable expitaxy condition. The features of the present invention are as follows:

1. A p/n junction blue light light-emitting diode is easily fabricated.

2. Doping aluminum (Al) under the condition of Se/Zn ratio 3~5 during the epilayer growth period, a high quality of n-type layer (in which self-activation center (SA center) phenomenon disappears) is fabricated. The doping concentration and the resistivity $\rho$ are $3\times10^{18}$ cm$^{-3}$ and 0.01 $\Omega$–cm, respectively.

3. Doping nitrogen under the condition of a relatively higher Se/Zn ratio compared to the step of n-type doping, a p-type epilayer of high quality is obtained. The doping concentration and the resistivity $\rho$ can be $5\times10^{17}$ cm$^{-3}$ and 0.5 $\Omega$–cm, respectively.

4. The blue light light-emitting diode fabricated by this method has the properties of emitting light at wave-length 461 nm under room temperature and of a spectrum full width in half maximum (FWHM) of 52 meV. All these show it is a pure blue light light-emitting diode and it is valuable in the market.

While the invention has been described in terms of what is presently considered to be the most practical and preferred embodiment, it is to be understood that the invention is not limited to the disclosed embodiment. On the contrary, it is intended to cover various modification and similar arrangements included within the spirit and scope of the appended claims, the scope of which should be accorded the broadest interpretation so as to encompass all such modifications and similar structures.

What is claimed is:

1. A method of fabricating an opto-electronic device comprising the steps of:

a) providing a chemical vapor deposition (CVD) reactor;

b) placing a substrate into said reactor;

c) providing a VI-group reacting gas flow;

d) providing a II-group reacting gas flow;

e) providing a p-dopant;

f) introducing said VI-group reacting gas flow and said II-group reacting gas flow in a first VI/II ratio ranged within about 7 and about 9 with the introduction of said p-dopant into said reactor to form a p-epilayer on said substrate;

g) providing an n-dopant; and h) introducing said VI-group reacting gas flow and said II-group reacting gas flow in a second VI/II ratio ranging within about 3 and about 5 with the introduction of said n-dopant into said reactor to form an n-epilayer on said substrate.

2. The method of fabricating an opto-electronic device as claimed in claim 1, wherein said device is one of a light emitting diode and a laser diode.

3. The method of fabricating an opto-electronic device as claimed in claim 1 wherein said chemical vapor deposition (CVD) is a low pressure organometallic vapor phase epitaxy.

4. The method of fabricating an opto-electronic device as claimed in claim 1, wherein in said step b), said substrate is made of gallium arsenide (GaAs).

5. The method of fabricating an opto-electronic device as claimed in claim 4, wherein said substrate is a highly-doped p-gallium arsenide (P$^+$GaAs).

6. The method of fabricating an opto-electronic device as claimed in claim 5 wherein said n-epilayer is located on said p-epilayer.

7. The method of fabricating an opto-electronic device as claimed in claim 1 wherein said VI-group reacting gas is a gas containing a VI A group element in the chemical periodic table.

8. The method of fabricating an opto-electronic device as claimed in claim 7, wherein said gas containing VI A group element is hydrogen selenide ($H_2Se$).

9. The method of fabricating an opto-electronic device as claimed in claim 1 wherein said II-group reacting gas is a gas containing a II B group element in the chemical periodic table.

10. The method of fabricating an opto-electronic device as claimed in claim 9, wherein said gas containing II B group element is diethyl zinc (DEZn).

11. The method of fabricating an opto-electronic device as claimed in claim 1, wherein said n-dopant is triethyl aluminum (TEA1).

12. The method of fabricating an opto-electronic device as claimed in claim 1, wherein said p-dopant is ammonia ($NH_3$).

13. The method of fabricating an opto-electronic device as claimed in claim 1 wherein said first VI/II ratio is about 8.

14. The method of fabricating an opto-electronic device as claimed in claim 1 wherein said second VI/II ratio is about 4.

* * * * *